(12) United States Patent
Nishimoto et al.

(10) Patent No.: US 9,976,232 B2
(45) Date of Patent: May 22, 2018

(54) ARTIFICIAL QUARTZ CRYSTAL GROWTH METHOD

(71) Applicant: Murata Manufacturing Co., Ltd., Nagaokakyo-shi, Kyoto-fu (JP)

(72) Inventors: Masatoshi Nishimoto, Nagaokakyo (JP); Yu Shirai, Nagaokakyo (JP); Sugao Yamaguchi, Nagaokakyo (JP); Takumi Shitara, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 103 days.

(21) Appl. No.: 15/046,726

(22) Filed: Feb. 18, 2016

(65) Prior Publication Data
US 2016/0160389 A1 Jun. 9, 2016

Related U.S. Application Data

(63) Continuation of application No. PCT/JP2014/066990, filed on Jun. 26, 2014.

(30) Foreign Application Priority Data

Aug. 29, 2013 (JP) ................................. 2013-178159

(51) Int. Cl.
*C30B 33/06* (2006.01)
*C30B 29/18* (2006.01)
*C30B 7/10* (2006.01)

(52) U.S. Cl.
CPC ............... *C30B 33/06* (2013.01); *C30B 7/10* (2013.01); *C30B 29/18* (2013.01)

(58) Field of Classification Search
None
See application file for complete search history.

(56) References Cited

U.S. PATENT DOCUMENTS

| | | | |
|---|---|---|---|
| 4,381,214 A * | 4/1983 | Christie | .................... C30B 7/00 117/1 |
| 5,377,615 A | 1/1995 | Detaint et al. | |
| 2010/0031875 A1 * | 2/2010 | D'Evelyn | ................ B01J 3/008 117/71 |

FOREIGN PATENT DOCUMENTS

| | | |
|---|---|---|
| EP | 0 123 809 A2 | 11/1984 |
| JP | H06-128088 A | 5/1994 |
| JP | 2002-047098 A | 2/2002 |
| JP | 2003-146799 A | 5/2003 |

OTHER PUBLICATIONS

International Search Report issued for PCT/JP2014/066990, dated Aug. 5, 2014.

(Continued)

*Primary Examiner* — Duy Vu N Deo
*Assistant Examiner* — Erin F Bergner
(74) *Attorney, Agent, or Firm* — Arent Fox LLP

(57) ABSTRACT

An artificial quartz crystal growth method that includes applying a pressure that causes at least two substantially rectangular-parallelepiped-shaped quartz crystal substrates to abut each other in an X-axis direction with crystallographic axis directions of the quartz crystal substrates aligned with each other, and causing the at least two quartz crystal substrates to grow an artificial quartz crystal in a state where the pressure is being applied.

13 Claims, 9 Drawing Sheets

(56) References Cited

OTHER PUBLICATIONS

Written Opinion of the International Searching Authority issued for PCT/JP2014/066990, dated Aug. 5, 2014.
Jingzhu Zhang; "The Butt-joint Growth of a Synthetic Quartz"; Synthetic Quartz, China Academic Journal Electronic Publishing House, Issue Z1, Oct. 1, 1982, p. 79.

* cited by examiner

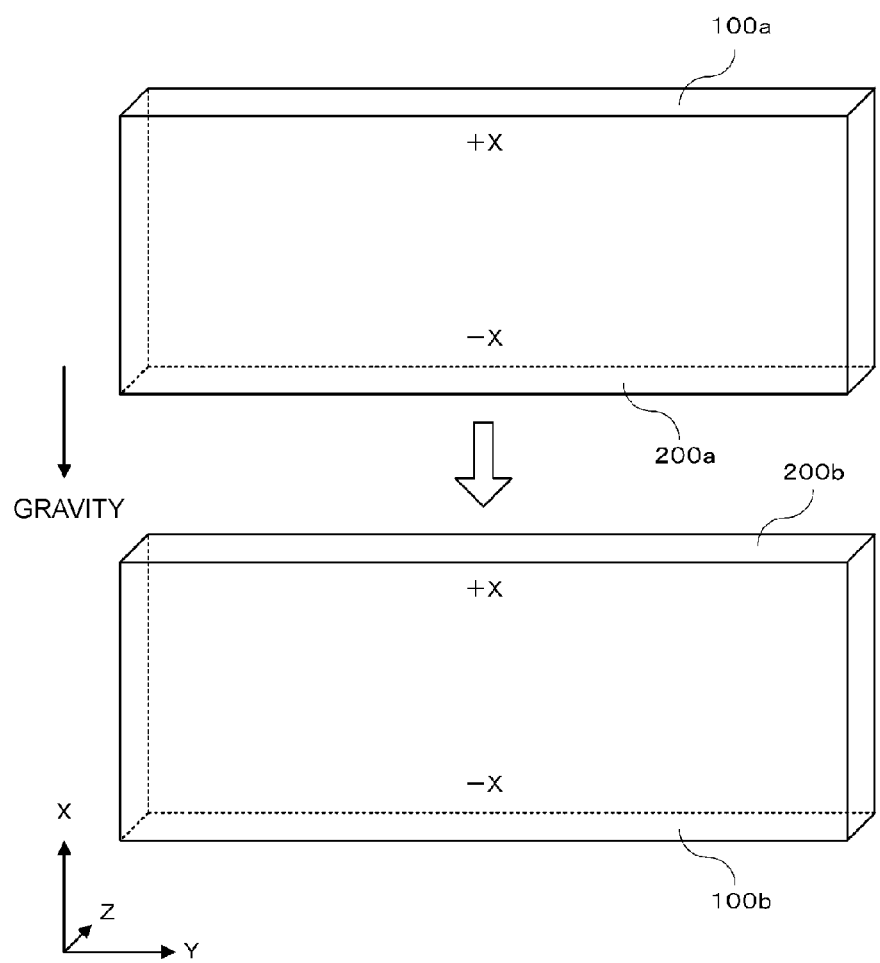

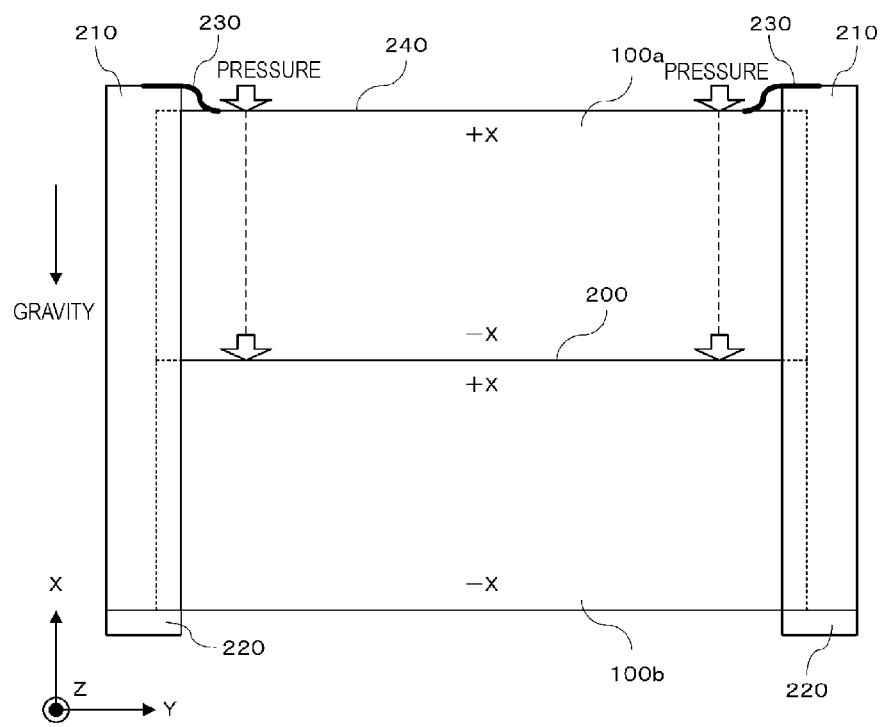

ARTIFICIAL QUARTZ CRYSTAL GROWTH METHOD

CROSS REFERENCE TO RELATED APPLICATIONS

The present application is a continuation of International application No. PCT/JP2014/066990, filed Jun. 26, 2014, which claims priority to Japanese Patent Application No. 2013-178159, filed Aug. 29, 2013, the entire contents of each of which are incorporated herein by reference.

FIELD OF THE INVENTION

The present invention relates to an artificial quartz crystal growth method.

BACKGROUND OF THE INVENTION

Quartz crystal devices are widely used in electronic devices, communication devices, optical devices and so forth. A quartz crystal is needed when manufacturing a device, but since using a natural quartz crystal as is would be difficult from the viewpoints of resources and cost, generally, an artificial quartz crystal, which is grown utilizing a natural quartz crystal as a seed, is used.

In artificial quartz crystal growth, large quartz crystals may be demanded with the aim of increasing productivity, for example. For example, in Patent Document 1, a method is disclosed in which a large artificial quartz crystal is obtained by using a quartz crystal seed formed by directly joining a plurality of quartz crystal substrates to each other.

Patent Document 1: Japanese Unexamined Patent Application Publication No. 2002-47098

SUMMARY OF THE INVENTION

In the method disclosed in Patent Document 1, since the quartz crystal seed is formed by directly joining together a plurality of quartz crystal substrates through a siloxane bond for example, it is difficult to align the axes of the plurality of quartz crystal substrates with each other and axis misalignment is likely to occur.

The present invention was made in light of the above-described circumstances and an object thereof is to provide a method of growing a large artificial quartz crystal in which axis misalignment is unlikely to occur.

An artificial quartz crystal growth method according to an aspect of the present invention includes: applying a pressure that causes at least two substantially rectangular-parallelepiped-shaped quartz crystal substrates to abut each other in an X-axis direction with crystallographic axis directions of the quartz crystal substrates aligned with each other; and causing the at least two quartz crystal substrates to grow an artificial quartz crystal in a state where the pressure is being applied.

According to the present invention, since the quartz crystal substrates are joined together during the growth of the artificial quartz crystal, a method of growing a large artificial quartz crystal in which axis misalignment is unlikely to occur can be provided.

BRIEF DESCRIPTION OF THE DRAWINGS

FIG. 2A illustrates an example of the way in which two quartz crystal substrates are made to abut each other.

FIG. 2C illustrates an example of a state in which two quartz crystal substrates are fixed to each other using a jig.

DETAILED DESCRIPTION OF THE PREFERRED EMBODIMENTS

Figure 1:
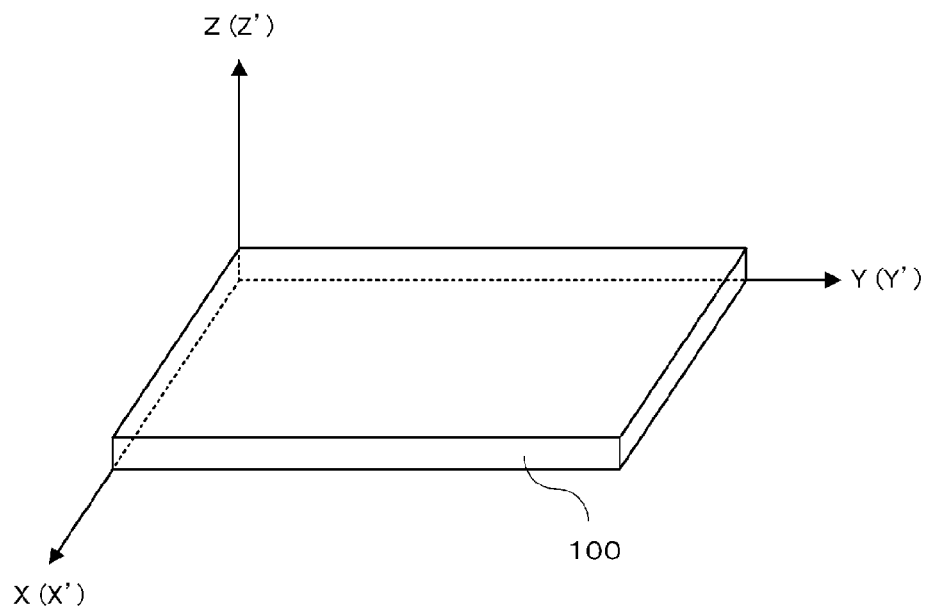
FIG. 1 illustrates the exterior of a quartz crystal substrate in an embodiment.

Hereafter, an embodiment of the present invention will be described while referring to the drawings. FIG. 1 illustrates the exterior of a quartz crystal substrate in this embodiment. A quartz crystal substrate 100 is used as a seed when growing an artificial quartz crystal and has a substantially rectangular parallelepiped shape having XYZ axes. In the example illustrated in FIG. 1, XYZ axes of the quartz crystal substrate 100 coincide with axes (X'Y'Z' axes) of the rectangular parallelepiped shape.

Figure 2B:
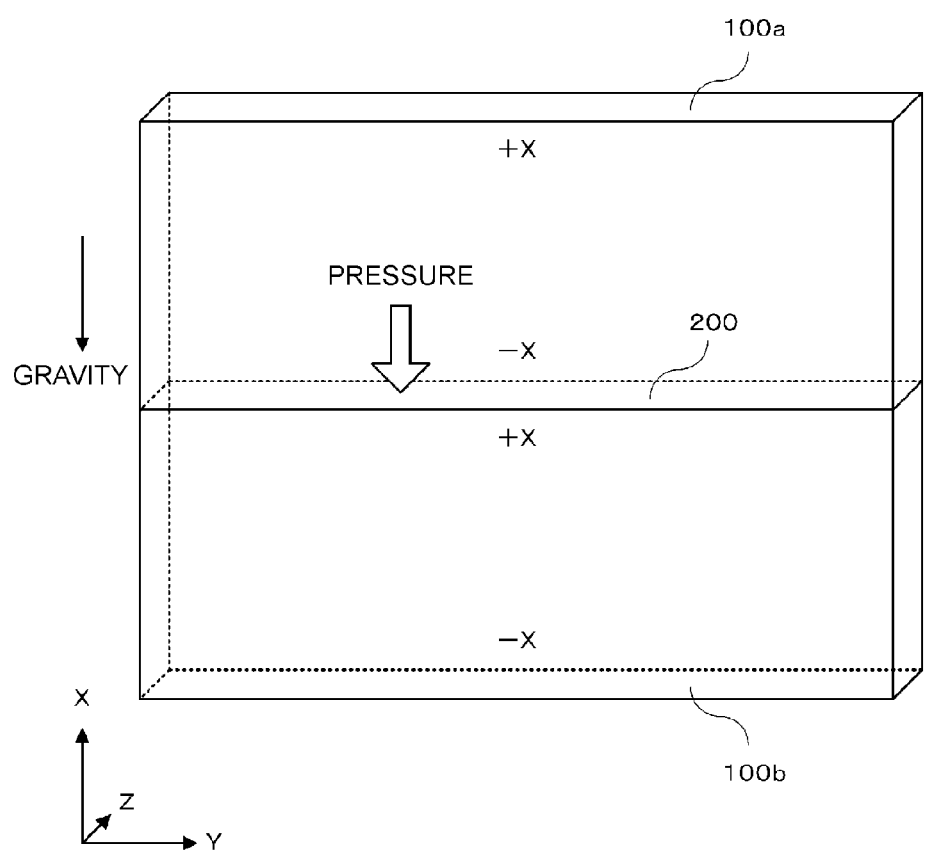
FIG. 2B illustrates an example of a state in which two quartz crystal substrates are arranged so as to abut each other at abutment surfaces in X-axis directions.

Referring to FIGS. 2A to 2C, an example of the arrangement of quartz crystal substrates 100 when growing an artificial quartz crystal will be described. FIG. 2A illustrates an example of the way in which two quartz crystal substrates 100 (100a, 100b) are made to abut each other. As illustrated in FIG. 2A, a surface 200a of the quartz crystal substrate 100a on the −X direction side and a surface 200b of the quartz crystal substrate 100b on the +X direction side abut each other such that the directions of the crystallographic axes (XYZ axes) of the two quartz crystal substrates 100a and 100b are aligned. In FIG. 2A, gravity acts in the −X direction.

FIG. 2B illustrates an example of a state in which the two quartz crystal substrates 100 are arranged so as to abut each other at the abutment surfaces 200 (200a, 200b) in the X-axis directions. The two quartz crystal substrates 100 are arranged so as to be stacked one on top of the other in the vertical direction (direction of gravity) and therefore a pressure due to the weight of the quartz crystal substrate 100a arranged on the upper side in the vertical direction is applied to the abutment surfaces 200. The two quartz crystal substrates 100 are in a state of closely contacting each other at the abutment surfaces 200 due to this pressure.

FIG. 2C illustrates an example of a state in which the two quartz crystal substrates 100 are fixed to each other using a jig. As illustrated in FIG. 2C, the jig includes three types of members 210, 220 and 230.

The members 210 support the two quartz crystal substrates 100 from both sides (−Y direction and +Y direction). End portions of the quartz crystal substrates 100 in the −Y direction and the +Y direction fit into grooves formed in the members 210.

The members 220 are provided in order to support the quartz crystal substrates 100 such that the quartz crystal substrates 100, which are fitted into the grooves in the members 210, do not fall in the −X direction due to gravity.

The members 230 apply a pressure to a surface 240 of the quartz crystal substrate 100a that is located in the +X direction (outermost surface of quartz crystal substrates 100 in X-axis directions). That is, the members 230 apply a pressure to the surface 240 that is parallel to the abutment surfaces 200 of the two quartz crystal substrates 100. In this way, a pressure is applied to the abutment surfaces 200 and the degree of closeness of the two quartz crystal substrates 100 is increased. The members 230 have elasticity in the X-axis directions. Specifically, the members 230 have a property of extending in the −X direction. Thus, since the members 230 have elasticity, the application of pressure to the abutment surfaces 200 can be maintained due to the members 230 extending in the −X direction, even when the abutment surfaces 200 melt by around several microns due to thermal etching, for example.

Figure 3:
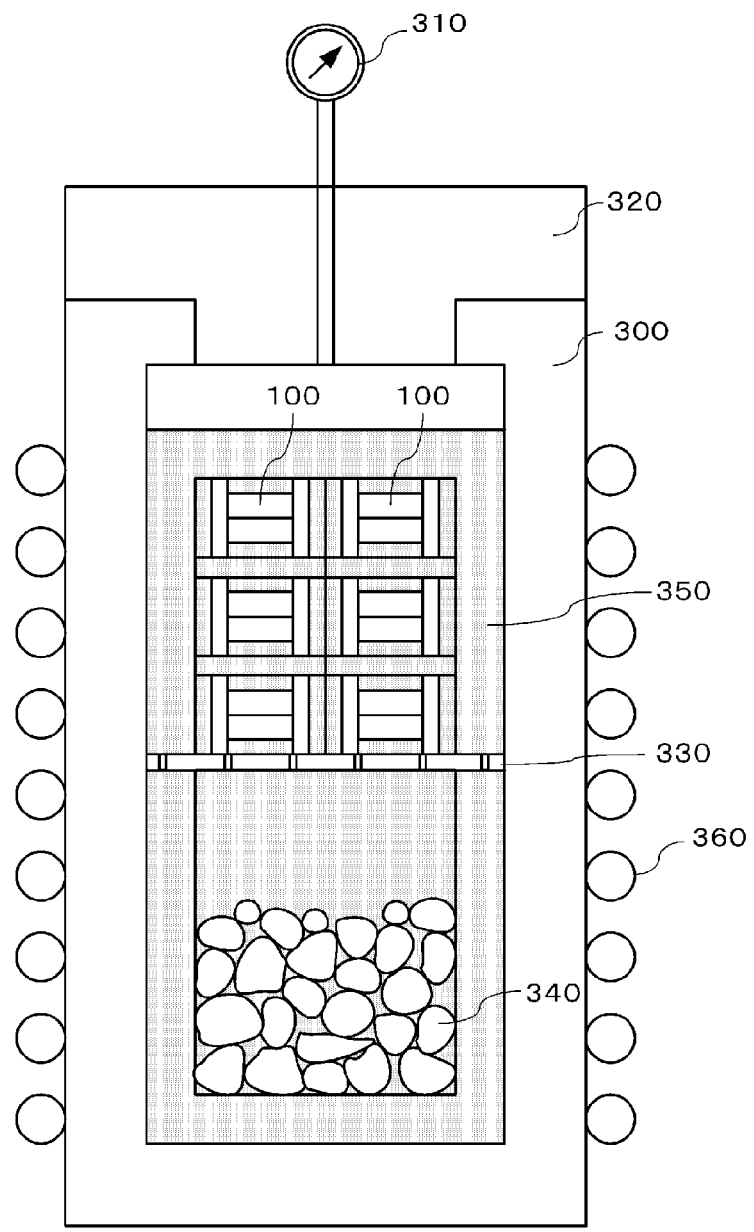
FIG. 3 illustrates an example of the way in which an artificial quartz crystal is grown using quartz crystal substrates by using a hydrothermal synthesis method.

FIG. 3 illustrates an example of the way in which an artificial quartz crystal is grown using quartz crystal substrates 100 by using a hydrothermal synthesis method. An autoclave (metal cylindrical furnace) 300 is hermetically sealed by a metal cap 320 that includes a pressure gauge 310 that can measure the pressure inside the autoclave 300. The inside of the autoclave 300 is vertically partitioned by a baffle plate (convection control plate) 330. A plurality of sets of quartz crystal substrates 100 (100a, 100b), which are each arranged as illustrated in FIG. 2C, are housed above the baffle plate 330. In addition, lasca (waste quartz crystal) 340 is housed below the baffle plate 330. A growth solution (for example, a sodium hydroxide (NaOH) solution) 350 for growing an artificial quartz crystal is injected into the inside of the autoclave 300. A heater 360 for heating the autoclave 300 is provided outside the autoclave 300.

The temperature of the upper part of the autoclave 300 is controlled to be around 300 to 350° C. and the temperature of the lower part of the autoclave 300 is controlled to be around 360 to 400° C. for example by the heater 360.

The quartz crystal substrates 100 are thermally etched by the heat of the heater 360. That is, the surfaces of the quartz crystal substrates 100 are melted by around several microns and processing-distorted layers of the quartz crystal substrates 100 are removed. The quartz crystal substrates 100 in each set are stacked one on top of the other in the vertical direction and therefore a state is maintained in which the quartz crystal substrates 100 closely contact each other due to the pressure resulting from the weight of the quartz crystal substrate 100a arranged on the upper side in the vertical direction even when the abutment surfaces 200 melt due to the thermal etching. Thus, the occurrence of axis misalignment can be suppressed in each set of quartz crystal substrates 100. In addition, since pressure is applied by the members 230 having elasticity in the X-axis directions to each set of quartz crystal substrates 100, the pressure applied to the abutment surfaces 200 in each set of quartz crystal substrates 100 is increased. Therefore, the effect of suppressing axis misalignment in each set of quartz crystal substrates 100 can be further increased.

The lasca 340 is heated by the heater 360 and dissolves into the growth solution 350. The growth solution 350, in which the lasca 340 is dissolved and which is saturated with $SiO_2$ molecules, undergoes convection inside the autoclave 300 due to the vertical temperature difference inside the autoclave 300. The growth solution 350 flows around the quartz crystal substrates 100 via this convention current. The temperature is lower around the quartz crystal substrates 100 than in the lower part of the autoclave 300 and therefore the $SiO_2$ molecules inside the growth solution 350 enter a supersaturated state and precipitate on the surfaces of the quartz crystal substrates 100. As a result, an artificial quartz crystal is grown with the quartz crystal substrates 100 serving as a seed.

Figure 4:
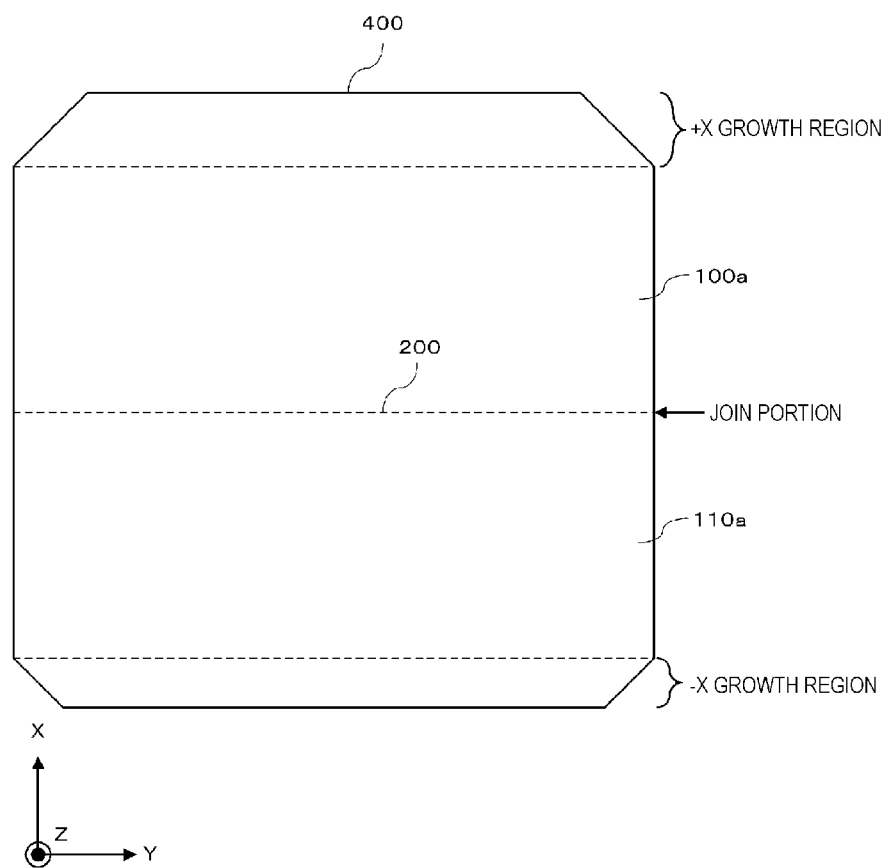
FIG. 4 illustrates an example of an artificial quartz crystal grown using quartz crystal substrates as a seed.

FIG. 4 illustrates an example of an artificial quartz crystal grown using the quartz crystal substrates 100 illustrated in FIGS. 2A to 2C as a seed. As illustrated in FIG. 4, an artificial quartz crystal 400 is a quartz crystal in which a set of quartz crystal substrates 100 are joined to each other at the abutment surfaces 200 and that grows in the X-axis directions. Growth is greater in the +X direction than in the −X direction among the X-axis directions. In addition, although not illustrated in FIG. 4, the quartz crystal substrates 100 also grow in the Z-axis directions. The quartz crystal substrates 100 hardly grow at all in the Y-axis directions.

Thus, the artificial quartz crystal 400 that is large in the X-axis directions can be obtained with the artificial quartz crystal growth method according to this embodiment. When growing the artificial quartz crystal 400, the pressure due to the weight of the quartz crystal substrate 100a, which is on the upper side in the vertical direction, is applied to the abutment surfaces 200 of the set of quartz crystal substrates 100, the abutment surfaces 200 being located in the X-axis directions. As a result, since the quartz crystal substrates 100 are joined together during the growth of the artificial quartz crystal 400, it is possible to suppress axis misalignment in the artificial quartz crystal 400. Furthermore, since a pressure is applied to the surfaces located outermost in the X-axis directions by the members 230, which have elasticity in the X-axis directions, the effect of suppressing axis misalignment can be further increased.

An even larger artificial quartz crystal could be obtained by using as a seed a quartz crystal substrate extracted from the artificial quartz crystal 400 grown using the artificial quartz crystal growth method of this embodiment. For example, a large artificial quartz crystal could be obtained in which a total of four quartz crystal substrates 100 are joined together by using two artificial quartz crystals 400, each grown using two quartz crystal substrates 100 as described in this embodiment.

This embodiment is to facilitate easy understanding of the present invention and is not to be interpreted as limiting the present invention. The present invention can be changed/improved without departing from the gist of the present invention and such equivalents are also included in the present invention.

Figure 5:
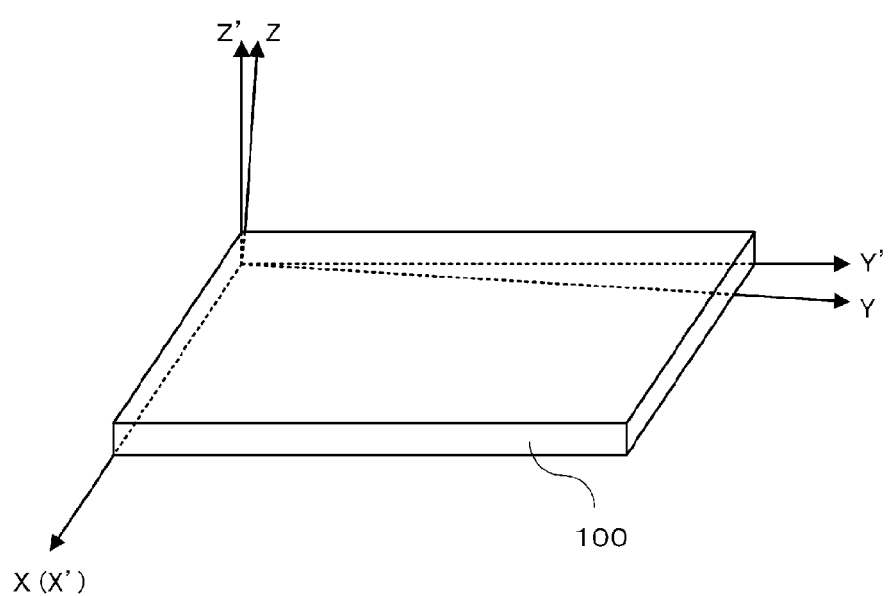
FIG. 5 illustrates an example of a state in which axial directions of a quartz crystal substrate are shifted from axial directions of a rectangular parallelepiped shape.

For example, the quartz crystal substrates 100 of each set are arranged so as to abut each other (FIG. 2B) in a state where the XYZ axes of the quartz crystal substrates 100 are aligned with the axes (X'Y'Z' axes) of the rectangular parallelepiped shape (FIG. 1) in this embodiment, but the relationship between the axial directions of the quartz crystal substrates 100 and the axial directions of the rectangular parallelepiped shape are not limited to this provided that the quartz crystal substrates 100 of each set can be made to abut each other in the X-axis directions. For example, as illustrated in FIG. 5, the quartz crystal substrates 100 of a set may be made to abut each other in the X-axis directions with the XYZ directions of the quartz crystal substrates 100 aligned with each other in a state where the Y axis and the Z axis of the quartz crystal substrates 100 are shifted by several degrees from the Y' axis and the Z' axis of the rectangular parallelepiped shape.

Figure 6:
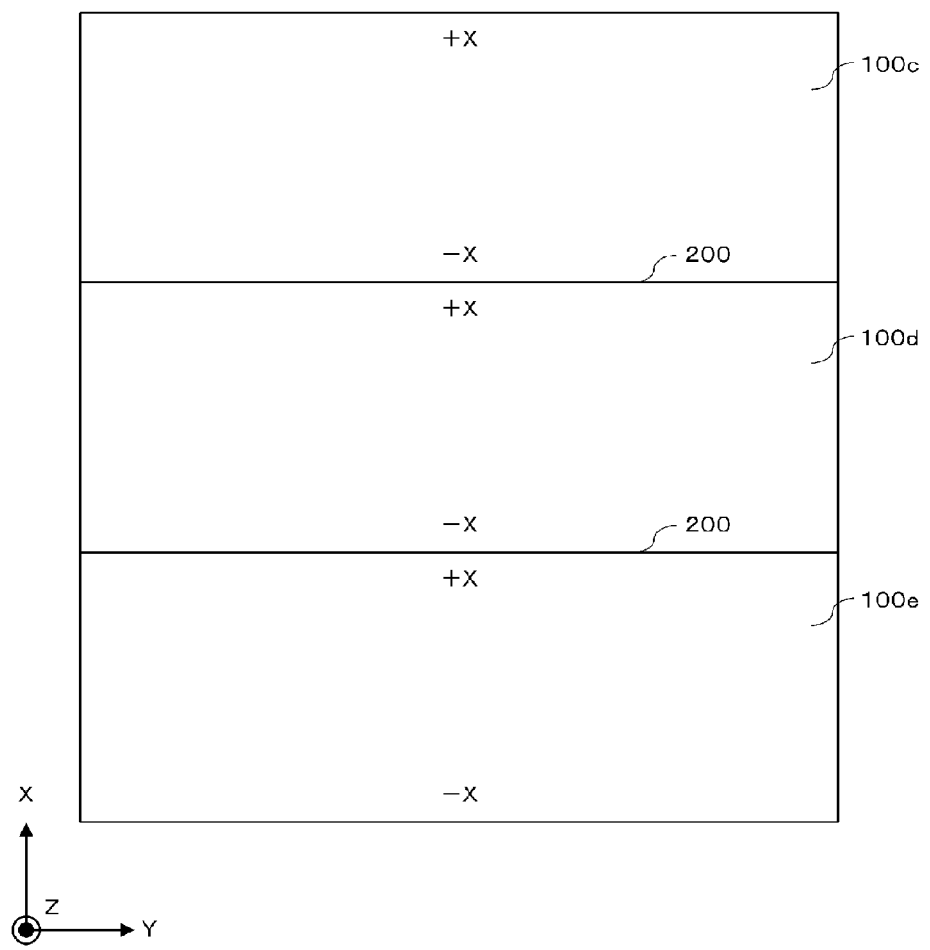
FIG. 6 illustrates an example of a state in which three quartz crystal substrates are arranged so as to abut each other at abutment surfaces in X-axis directions.

In addition, for example, two quartz crystal substrates 100a and 100b are illustrated as a set of quartz crystal substrates 100 in this embodiment, but the number of quartz crystal substrates to be joined together is not limited to two. For example, as illustrated in FIG. 6, three quartz crystal substrates 100c, 100d and 100e may be arranged so as to abut each other in the X-axis directions with the crystallographic axis directions of the quartz crystal substrates aligned with each other and be used as a seed to grow an artificial quartz crystal. In addition, three or more quartz crystal substrates may be used.

Figure 7:
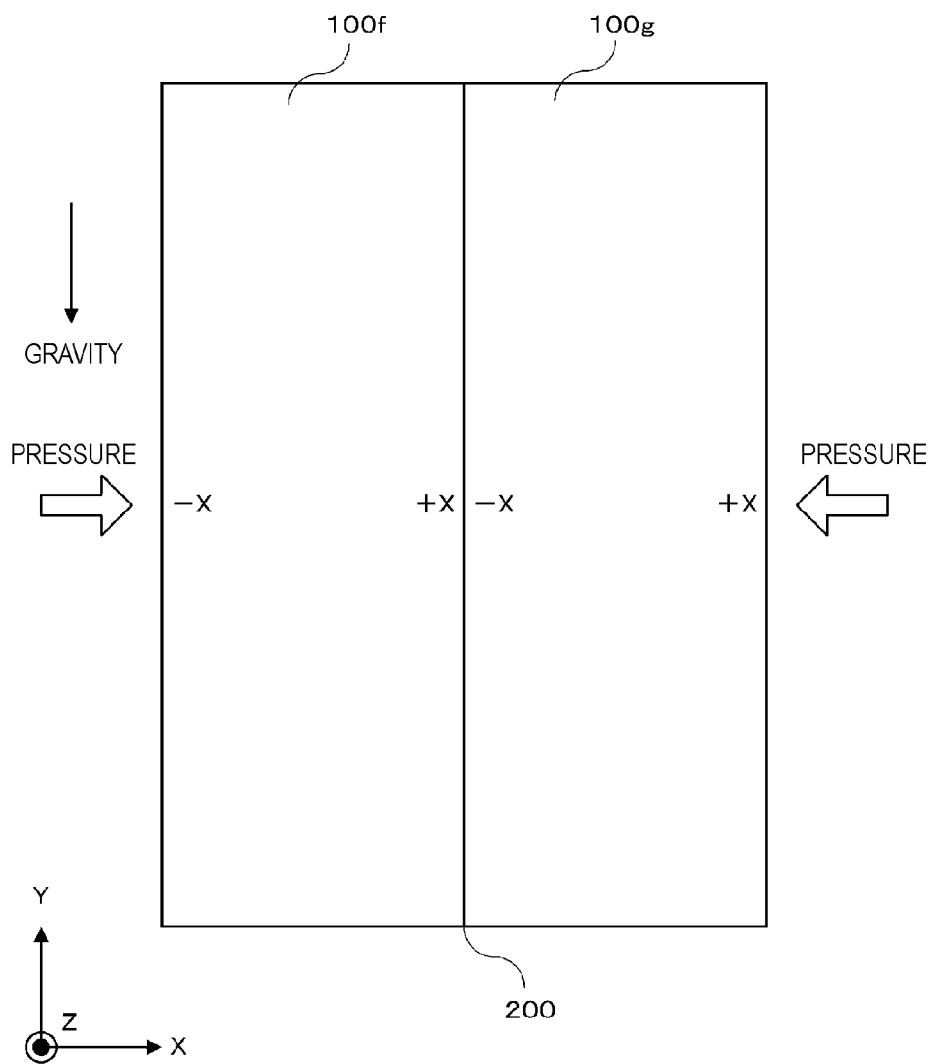
FIG. 7 illustrates an example of a state in which two quartz crystal substrates are arranged side by side in a horizontal direction.

Furthermore, for example, in this embodiment, a set of quartz crystal substrates 100 was stacked in the vertical direction, but the arrangement of quartz crystal substrates is not limited to this. For example, as illustrated in FIG. 7, two quartz crystal substrates 100f and 100g may be arranged side by side in the horizontal direction. In this case as well, the quartz crystal substrates 100 of a set are arranged so as to abut each other in the X-axis directions with the crystallographic axis directions of the quartz crystal substrates aligned with each other and a pressure is applied such that the abutment surfaces 200 closely contact each other. A pressure can be applied to the abutment surfaces 200 using a jig or the like that has elasticity in the X-axis directions, for example.

REFERENCE SIGNS LIST 100 quartz crystal substrate
200 abutment surface
210 to 230 jig
300 autoclave
310 pressure gauge
320 metal cap
330 baffle plate
340 lasca
350 growth solution
360 heater

The invention claimed is:

1. An artificial quartz crystal growth method comprising:
preparing at least two quartz crystal substrates, each of which having a pair of main surfaces and four side surfaces each connecting to the pair of main surfaces;
abutting the at least two quartz crystal substrates to each other at respective side surfaces of the four side surfaces in an X-axis direction such that crystallographic axis directions of the at least two quartz crystal substrates are aligned with each other;
applying a pressure to the at least two quartz crystal substrates in the X-axis direction; and
causing the at least two quartz crystal substrates to grow an artificial quartz crystal while the pressure is being applied.

2. The artificial quartz crystal growth method according to claim 1, wherein the at least two quartz crystal substrates are rectangular-parallelepiped-shaped.

3. The artificial quartz crystal growth method according to claim 1, wherein the at least two quartz crystal substrates include three or more quartz crystal substrates.

4. The artificial quartz crystal growth method according to claim 3, wherein the three or more quartz crystal substrates are stacked on top of one another in a vertical direction.

5. The artificial quartz crystal growth method according to claim 4, wherein the pressure is applied by a weight of a quartz crystal substrate arranged on an upper side in the vertical direction among the three or more quartz crystal substrates.

6. The artificial quartz crystal growth method according to claim 4, wherein the pressure is applied to an outermost surface in the X-axis direction of the three or more quartz crystal substrates.

7. The artificial quartz crystal growth method according to claim 6, wherein the pressure is applied to the outermost surface by a jig having elasticity in the X-axis direction.

8. The artificial quartz crystal growth method according to claim 1, wherein the at least two quartz crystal substrates are stacked on top of one another in a vertical direction.

9. The artificial quartz crystal growth method according to claim 8, wherein the pressure is applied by a weight of a quartz crystal substrate arranged on an upper side in the vertical direction among the at least two quartz crystal substrates.

10. The artificial quartz crystal growth method according to claim 8, wherein the pressure is applied to an outermost surface in the X-axis direction of the at least two quartz crystal substrates.

11. The artificial quartz crystal growth method according to claim 10, wherein the pressure is applied to the outermost surface by a jig having elasticity in the X-axis direction.

12. The artificial quartz crystal growth method according to claim 1, wherein the pressure is applied to an outermost surface in the X-axis direction of the at least two quartz crystal substrates.

13. The artificial quartz crystal growth method according to claim 12, wherein the pressure is applied to the outermost surface by a jig having elasticity in the X-axis direction.

* * * * *